United States Patent [19]

Lapetina et al.

[11] Patent Number: 4,733,379

[45] Date of Patent: Mar. 22, 1988

[54] LINE ARRAY TRANSDUCER ASSEMBLY

[75] Inventors: Robert A. Lapetina; Gordon L. Snow; David P. Baird, all of Salt Lake City, Utah

[73] Assignee: Edo Corporation/Western Division, Salt Lake City, Utah

[21] Appl. No.: 840,603

[22] Filed: Mar. 17, 1986

Related U.S. Application Data

[63] Continuation-in-part of Ser. No. 661,082, Oct. 15, 1984.

[51] Int. Cl.$^4$ .............................................. G01V 1/38
[52] U.S. Cl. ...................... 367/20; 367/154; 367/162; 367/166; 174/101.5
[58] Field of Search ................... 367/15, 20, 106, 130, 367/153, 154, 155, 157, 160, 165, 166, 177; 181/110; 174/101.5

[56] References Cited

U.S. PATENT DOCUMENTS

| Re. 32,123 | 4/1986 | Knight | 367/127 |
|---|---|---|---|
| 3,286,227 | 11/1966 | Aldrich | 367/154 |
| 3,346,838 | 10/1967 | Johnson et al. | 367/155 |
| 3,359,537 | 12/1967 | Geil et al. | 367/155 |
| 3,603,921 | 9/1971 | Dreisbach | 367/155 |
| 3,659,258 | 4/1972 | Abbott | 367/157 |
| 4,035,049 | 7/1977 | McKee | 339/97 R |
| 4,160,229 | 7/1979 | McGough | 367/154 |
| 4,300,218 | 11/1981 | Kruka et al. | 367/165 |
| 4,636,998 | 1/1987 | Greene et al. | 367/154 |

FOREIGN PATENT DOCUMENTS 2145226 7/1984 United Kingdom ................ 367/20

Primary Examiner—Charles T. Jordan
Assistant Examiner—John W. Eldred
Attorney, Agent, or Firm—Thorpe, North & Western

[57] ABSTRACT

A flexible line array transducer assembly for detecting underwater acoustical signals. The assembly includes an array of spaced-apart piezoelectric elements arranged generally in a line and selected to have low cross-coupling characteristics, low sensitivity to incoherent mechanical perturbations in the directions longitudinal and lateral to the axis of the array, and high sensitivity to coherent mechanical perturbations such as acoustical signals. The elements are polarized in a direction generally transverse to the array and each include opposing surface areas which are generally parallel with the linear axis of the array. Electrodes are disposed on the opposing surface areas of the elements and are coupled to conductors which carry signals produced by the piezoelectric elements when the elements are stressed by acoustical signals. A porous, open-cell material is disposed about the piezoelectric elements as an encasement to maintain the elements in place and mechanically isolate the elements. An outer, water-tight jacket encloses the open cell material and holds a fill fluid carried within the open-cell material. An electrically conductive flexible sleeve may be placed either about the open-cell material or about the outer jacket to shield the piezoelectric elements from electromagnetic waves.

27 Claims, 4 Drawing Figures

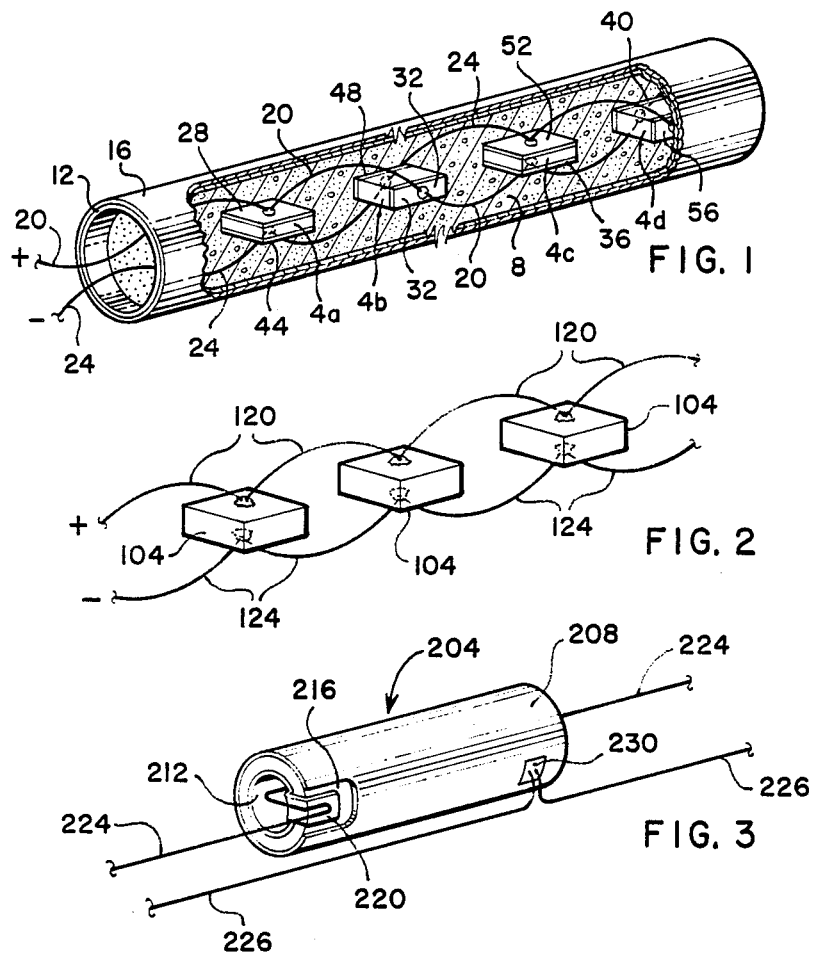
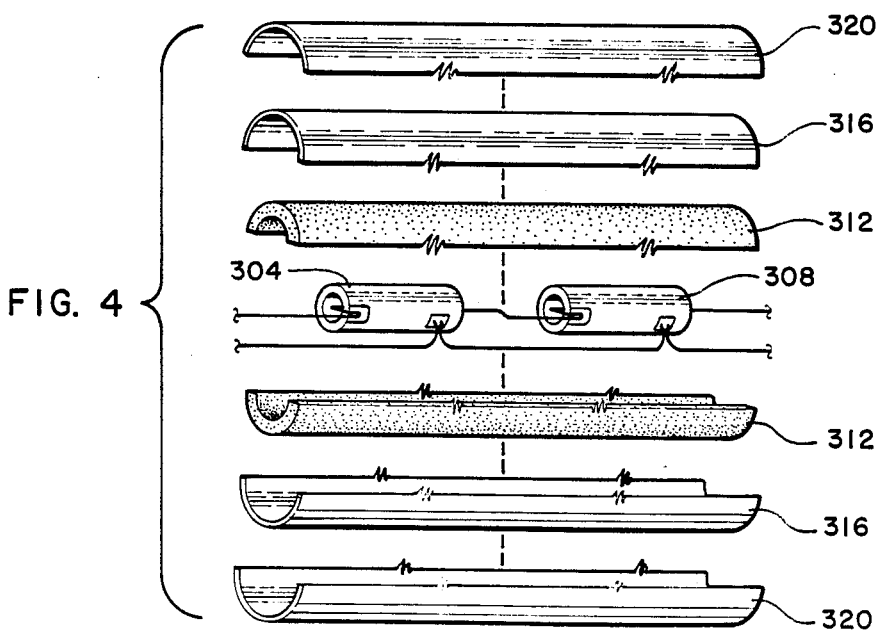

LINE ARRAY TRANSDUCER ASSEMBLY

BACKGROUND OF THE INVENTION

This is a continuation-in-part application of Ser. No. 06/661,082, filed Oct. 15, 1984.

This invention relates to a transducer assembly having a linear array of piezoelectric elements held in a flexible casing.

Piezoelectric elements, primarily crystals and ceramics, are employed in a variety of devices including crystal microphones, ultrasonic devices, accelerometers and oscillators. One of the most common uses of piezoelectric elements is in underwater sonar equipment in which a piezoelectric sonar transducer is stimulated by electrical signals to emit sonar signals which radiate out from the transducer. The sonar signals are reflected from underwater objects and the reflected signals are detected by the transducer which produces electrical signals carrying information about the underwater objects.

New applications in anti-submarine warfare have created a need for sonar listening (only) arrays which can be formed in very long, thin configurations for towing through the water behind a vessel. It is desireable that these arrays be capable of detecting very low level signals in the presence of relatively high level self-generated noise (which occurs as a result of towing the long arrays through the water at high speeds). Three major areas where self-generated noise limits the target noise levels that can be detected by passive listening sonar systems are as follows:

a. axial or longitudinal pressure waves generated within the array due to longitudinal acceleration forces resulting from towing at high speeds;

b. radial or transverse pressure waves generated when the line array undulates vertically or horizontally as it is towed through the water; and c. turbulent boundary layer (TBL) noise generated along the array by the flow of water passing over the outer jacket of the array as it is towed at high speed through the water.

Typical transducers utilized in passive array systems consist of single crystal or ceramic elements located at discrete locations along or in the array. Although flexible arrays of piezoelectric elements have been proposed, they typically suffer from the well known problems of high sensitivity to the above stated self generated incoherent noise sources, which prevents detection of coherent noise sources generated by the targets of interest. In addition, utilization of prior art sensors to attempt to reduce the detrimental effects of the self generated noise are oftentimes complex in construction and costly to manufacture. Some examples of prior art line array transducers are disclosed in U.S. Pat. Nos. 3,359,537, 3,375,488 and 3,346,838.

SUMMARY OF THE INVENTION

It is an object of the invention to provide a flexible line array transducer assembly which is simple and inexpensive to construct.

It is also an object of the invention to provide such an assembly which is relatively insensitive to internally generated noise, and axial and transverse motions of the array.

It is a further object of the invention to provide such an assembly which has high hydrostatic mode (a mode of operation whereby the active material is exposed to acoustic energy on all surfaces).

It is an additional object of the invention to provide such an assembly which exhibits low dissipation and high figure of merit (a measure of the assembly's quality of operation; qualitatively it is the ratio of the assembly's signal to self noise).

The above and other objects of the invention are realized in an illustrative embodiment of a flexible line array transducer assembly especially adapted for towing underwater by a tow vehicle to detect acoustic signals. The assembly includes a plurality of spaced-apart piezoelectric elements arranged generally in a line. The elements are selected to have low cross-coupling characteristics, low sensitivity to incoherent mechanical perturbations in the directions longitudinal and lateral to the axis of the array, and high sensitivity to coherent mechanical perturbations such as the reception of acoustic waves. Each of the elements includes opposed surface areas which are generally parallel to the linear axis of the array, and the elements are polarized across the opposed surface areas. Conductors are coupled to electrodes formed on the opposed surface areas to carry therefrom electrical signals produced by the elements when they are mechanically stressed by acoustical signals. A porous open-cell foam is disposed about the piezoelectric elements as an encasement to hold the elements in place, and an outer water-tight jacket is formed about the open-cell material to prevent access of water to the elements. A fill fluid is carried by the open-cell material within the jacket.

With this configuration, a high signal-to-noise ratio is achieved resulting in more accurate and efficient underwater acoustical measurements.

BRIEF DESCRIPTION OF THE DRAWINGS

The above and other objects, features and advantages of the invention will become apparent from a consideration of the following detailed description presented in connection with the accompanying drawings in which:

FIG. 1 shows a perspective, partially cut-away view of a portion of a flexible line array transducer assembly made in accordance with the principles of the present invention;

FIG. 2 is a perspective view of another embodiment for interconnecting the piezoelectric elements of the array of FIG. 1;

FIG. 3 is a perspective view of a hollow, cylindrical piezoelectric element coupled to two conductor wires; and FIG. 4 is an exploded view of an alternative embodiment of a line array transducer assembly utilizing the piezoelectric element shown in FIG. 3.

DETAILED DESCRIPTION

Referring to FIG. 1, there is shown an illustrative embodiment of a portion of a flexible line array transducer assembly. The assembly includes a plurality of piezoelectric elements 4 spaced-apart generally in a line and held in place in a porous, open-cell, flexible foam material 8. The piezoelectric elements 4, which may be either crystal or ceramic, are formed of elongate bars having top and bottom generally opposing surface areas, and two side generally opposing surface areas. The elements are made of a material selected to have low cross-coupling characteristics, i.e., acoustic energy received along one direction or axis of the elements is not manifested by mechanical deformation in another direction or axis of the element. The elements are also selected and oriented to have low sensitivity to incoherent mechanical perturbations or movement in the directions longitudinal or lateral to the axis of the array and to have high sensitivity to coherent mechanical perturbations, such as reception of acoustical signals. The elements are polarized in a direction transverse to the linear axis of the array and across pairs of opposing surface areas of the elements (the top and bottom and two side surface areas of the elements are generally parallel with the linear axis of the array).

Exemplary material from which the elements 4 may be fabricated to have the characteristics mentioned above are lead metaniobate, lead titanate, perforated lead zirconate titanate, perforated barium titanate, polyvinylidene flouride, and co-polymer of polyvinylidene flourides.

By proper orientation and poling of the piezoelectric elements 4 in the array of FIG. 1, the elements are effectively immunized against vibration movement or other mechanical perturbations operating longitudinally or laterally along the array. On the other hand, the piezoelectric elements 4 maintain a high hydrostatic sensitivity. The array of FIG. 1 would generally be used for underwater acoustical energy detection while being towed behind a tow vehicle.

The foam material 8 is provided to maintain the relative position of the piezoelectric elements and to mechanically isolate the elements from one another. Advantageously, the foam material would have a porosity of from 12 to 20 pores per centimeter and a density of about 0.028 grams per cubic centimeter. An illustrative foam material is SIF type Z polyurethane open-cell foam, either ether based or ester based. Alternative materials or support arrangements could also be used to mechanically isolate the piezoelectric elements.

Formed around the foam material 8 is an electrically conductive, flexible cloth sleeve 12 provided to shield the piezoelectric elements 4 from electromagnetic waves. The sleeve 12 could illustratively be a commerically available metalized cloth or a conductive elastomer.

A flexible water-tight outer jacket 16 is formed about the conductive shield 12 to enclose the porous material 8 and piezoelectric elements 4. The jacket 16 is provided to prevent the external access of fluid to the piezoelectric elements 4. The jacket may be made of a compliant flexible elastomer material such as neoprenes, polyurethanes, rubbers, and vinyles. If the array of piezoelectric elements 4 were part of a more extensive hydrophone structure which, itself had a water-tight jacket, then the outer jacket 16 may not be necessary.

Carried by the foam material 8 for the free flow therethrough is a fill fluid such as isopar M. This fluid transmits mechanical perturbations from the outside to the piezoelectric elements, aids in preventing damage to the assembly by external water pressures, and provides some buoyancy (if required) to the assembly to help in maintaining a fairly constant depth underwater when the assembly is being towed.

A pair of conductors 20 and 24 interconnect the piezoelectric elements 4 to carry electrical signals produced when the elements are stressed by the receipt of acoustical signals. Conductor 20 is connected to the positive electrode of each of the elements and conductor 24 is connected to the negative electrode. The conductors are connected to the elements in a helical fashion with, for example, conductor 20 being connected to an electrode 28 placed on the upper surface of the piezoelectric element 4a, then to an electrode 32 placed on the side surface area of piezoelectric element 4b, next to an electrode 36 placed on the bottom surface of element 4c, onto an electrode 40 placed on the side surface area of element 4d, etc. Conductor 24 is connected to the opposite surface areas on the piezoelectric elements, namely to an electrode 44 placed on the bottom surface of piezoelectric element 4a, to an electrode 48 placed on the far side surface area of element 4b, to electrode 52 placed on the top surface of element 4c, and then to electrode 56 placed on the near side surface area of element 4d, etc. Poling and orienting the piezoelectric elements 4 in the manner shown in FIG. 1 has been found to be especially advantageous to minimizing the effects of internally generated noises and noises generated in the turbulent boundary layer adjacent to the towed array.

Although not specifically shown in FIG. 1, the conductors 20 and 24 would exit the outer jacket 16 through sealed openings so as to maintain the water-tight integrity of the assembly, and connect to conventional circuitry for processing signals carried by the conductors to, for example, produce spectrograms representing the detected acoustical signals. Conductors 20 and 24 are composed of flexible, braided wires and loosely interconnect the piezoelectric elements. For example, each conductor 20 and 24 might advantageously consist of 25 strands of 46 gauge wire braided together. Provision of the flexible, loosely interconnected conductors 20 and 24 ensures the mechanical isolation of each piezoelectric element from the others, and minimizes the chance of flexure fractures in the conductors.

The electrodes 28, 32, etc., formed on the piezoelectric elements 4 cover substantially the entire surface areas on which they are placed. The conductors 20 and 24 are spot soldered or welded to the electrodes to allow for ease of manufacture and assembly. The electrodes advantageously are made of thin sheets of silver, gold, copper, nickel, or other conductive metals attached to the piezoelectric elements by a conductive adhesive.

An alternative to placing the conductive shield 12 about the foam material 8 would be to simply paint the outside of the outer jacket 16 (or inside) with a conductive film such as a conductive elastomer. Still another alternative would be to place a conductive, flexible cloth sleeve about the exterior of the jacket 16.

FIG. 2 shows an alternative embodiment for interconnecting piezoelectric elements 104 by conductors 120 and 124. In this embodiment, conductor 120 is coupled to electrodes formed on the upper surface areas of the piezoelectric elements and conductor 124 is coupled to electrodes formed on the bottom surface areas of the elements. Poling of the elements is still in a transverse direction to the linear axis of the array, as with the arrangement of FIG. 1, but the polarity of the elements is all in the same direction with the FIG. 2 arrangement. The piezoelectric elements 104 would be encapsulated in a foam material, surrounded by a conductive shield and outer jacket as with the FIG. 1 arrangement.

FIG. 3 shows a perspective view of another embodiment of the piezoelectric elements used in the transducer assembly. In this embodiment, a hollow, cylindrical piezoelectric element 204 is provided, with an outer electrode 208 and an inner electrode 212 being formed respectively on the outer and inner surface areas of the element. Electrode 208 includes a cutout section 216 to allow a portion of the inner electrode 212 to extend about the lip of the cylinder to form a portion 220 positioned on the exterior surface of the element. The portion 220 is electrically connected to the inner electrode 212 and a conductor 224 is spot soldered or welded to the portion 220 and then extends through the interior of the hollow cylinder to the next piezoelectric element. A conductor 226 is spot soldered or welded at location 230 to the outer electrode 208. Successive piezoelectric elements are connected in the same fashion to the conductors 224 and 226.

FIG. 4 shows hollow, cylindrical piezoelectric elements 304 and 308 connected together as they would be in an array and as shown in FIG. 3. Shown in exploded view are the coverings formed about the piezoelectric elements, the first of which is the porous, open-cell foam 312. The foam 312 would be disposed about the exterior of the piezoelectric elements, but would not be disposed in the hollow interiors thereof. The conductive, flexible cloth sleeve 316 for shielding the piezoelectric elements from electromagnetic waves would then be placed about the porous material 312. Finally, the outer jacket 320 encloses the other elements of the assembly and prevents external access of water to the interior thereof.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

What is claimed is:

1. A flexible transducer assembly comprising
    an array of spaced-apart piezoelectric elements arranged generally in a line and selected to have low cross-coupling characteristics, low sensitivity to incoherent mechanical perturbations in the directions longitudinal and lateral to the axis of the array, and high sensitivity to coherent mechanical perturbations, said elements being polarized in a direction generally transverse to the linear axis of the array, and each element including opposing surface areas which are generally parallel with the linear axis of the array,
    a plurality of electrodes disposed on said opposing surface areas of the piezoelectric elements,
    conductor means coupled to the electrodes of the piezoelectric elements to carry therefrom electrical signals produced by the elements when the elements are stressed by acoustical signals, and
    wherein at least some of said elements are arranged with their opposing surfaces aligned in a direction different from the direction of alignment of other of said elements.

2. A transducer assembly as in claim 1 further comprising
    porous, open-cell material disposed about the piezoelectric elements as an encasement to maintain the elements in place and to mechanically isolate the elements from one another, said material adapted to allow the flow therethrough of a fluid,
    an outer, water-tight jacket for enclosing the open-cell material,
    a fluid carried by the open-cell material within the jacket, and
    an electrically conductive shield means disposed to circumscribe the piezoelectric elements to shield the elements from electromagnetic waves.

3. A transducer assembly as in claim 2 wherein the shield means comprises an electrically conductive cloth material enclosing the open cell material.

4. A transducer assembly as in claim 2 wherein the shield means comprises an electrically conductive coating applied to the jacket.

5. A transducer assembly as in claim 1 wherein said electrodes cover substantially the entire surface areas on which they are disposed.

6. A transducer assembly as in claim 5 wherein said electrodes are comprised of a conductive sheet of material.

7. A transducer assembly as in claim 1 wherein the piezoelectric elements comprise elongate bars having generally opposing top and bottom surfaces, and generally opposing first and second side surfaces, wherein the electrodes are disposed on opposing surfaces of each element, and wherein the conductor means comprise a pair of conductors, one of which is coupled to one of the electrodes of each element and the other of which is coupled to the other electrode of each element.

8. A transducer assembly as in claim 7 wherein the conductors are spot soldered to the lectrodes.

9. A transducer assembly as in claim 7 wherein the electrodes are disposed on corresponding opposing surfaces of each element in the array so that the elements are all polarized in substantially the same transverse direction.

10. A transducer as in claim 7 wherein the electrodes are disposed alternately on the top and bottom surfaces and then the side surfaces of the elements in the array so that every other element in the array is polarized through the top and bottom surfaces, and the remaining elements are polarized through the side surfaces.

11. A transducer assembly as in claim 10 wherein one of said conductors is coupled successively to the top surface, first side surface, bottom surface, and second side surface in a helical fashion of a grouping of four successive piezoelectric elements, and the other of said conductors is coupled to the respective opposing surfaces of the elements of said grouping of four successive elements also in a helical fashion.

12. A transducer assembly as in claim 1 wherein said elements are made of material selected from the group consisting of lead metaniobate, lead titanate, perforated lead zirconate titanate, perforated barium titanate, polyvinylidene flouride, and co-polymer polyvinylidene flourides, with the direction of greater sensitivity of the material oriented transversely of the linear axis of the array.

13. A transducer assembly as in claim 1 wherein the conductor means comprise a pair of flexible wire conductors, loosely interconnecting the piezoelectric elements.

14. A transducer assembly as in claim 13 wherein each wire conductor comprises a plurality of wires braided together.

15. A transducer assembly as in claim 14 wherein said wires are composed of cadmium bronze.

16. A transducer assembly as in claim 2 wherein said porous, open-cell material comprises an inert solid foam having a porosity of from about 12 to 20 pores/centimeter.

17. A transducer assembly as in claim 16 wherein said foam is a polyurethane open-cell foam base selected from the group consisting of ether and ester.

18. A transducer assembly as in claim 16 wherein said foam is a polyethylene open-cell foam.

19. A transducer assembly as in claim 2 wherein said fill fluid has a positive buoyancy in water.

20. A flexible transducer assembly comprising
an array of piezoelectric elements spaced-apart generally in a line, and selected to have low cross-coupling characteristics, low sensitivity to incoherent mechanical perturbations or movement along the longitudinal and lateral axis of the array, and high sensitivity to coherent acoustical signals, each of said elements including oppositely facing surface areas which are generally parallel to the axis of the array, and being polarized across said oppositely facing surfaces,
conductor means coupled to the piezoelectric elements on the oppositely facing surfaces thereof for carrying electrical signals produced by the elements when they are stressed by acoustical signals,
means for supporting and maintaining the piezoelectric elements in position in the array while allowing transverse flexure of the array, and
said piezoelectric elements being oriented so that the oppositely facing surfaces of selected ones of the elements are aligned in directions different from the directions of alignment of other of said elements.

21. A flexible transducer assembly as in claim 20 further comprising
jacket means enclosing the supporting means, conductor means and piezoelectric elements for preventing external access of fluid to the elements,
means disposed within jacket means for mechanically coupling the piezoelectric elements to the jacket means, and
a flexible electrically conductive shield means disposed to shield the piezoelectric elements from externally generated electromagnetic waves.

22. A flexible transducer assembly as in claim 21 wherein said shield means comprises a flexible, electrically conductive cloth sleeve disposed about the elements.

23. A transducer assembly as in claim 21 wherein said supporting means comprises a porous, open-cell material disposed about and between the piezoelectric elements to maintain them in place and provide mechanical isolation between elements, said open-cell material being adapted to allow flow therethrough of fluid, and wherein said mechanical coupling means comprises a fluid carried by the open-cell material within the jacket means.

24. A transducer assembly as in claim 23 wherein said conductor means comprise a pair of flexible wire conductors connected loosely from one piezoelectric element to the next element in the array.

25. A transducer assembly as in claim 20 wherein said piezoelectric elements comprise elongate bars having top and bottom surfaces and first and second side surfaces, and wherein one of the wire conductors is coupled to one of the surfaces of each element and the other conductor is coupled to the opposite surface of each corresponding element.

26. A transducer assembly as in claim 25 wherein one of the conductors is coupled successively to selected ones of the top surface, first side surface, bottom surface, or second side surface, of the piezoelectric elements, with said one conductor being coupled to different surfaces of adjacent elements, and wherein the other conductor is coupled to the surface of each element opposite that to which the first conductor is coupled.

27. A transducer assembly as in claim 24 wherein the piezoelectric elements are made of material selected from the group consisting of lead metaniobate, lead titanate, perforated lead zirconate titanate, perforated barium titanate and copolymer polyvinylidene flourides.

* * * * *